(12) United States Patent
Youn et al.

(10) Patent No.: US 10,361,313 B2
(45) Date of Patent: Jul. 23, 2019

(54) ELECTRONIC DEVICE AND METHODS OF FABRICATING THE SAME

(71) Applicant: ELECTRONICS AND TELECOMMUNICATIONS RESEARCH INSTITUTE, Daejeon (KR)

(72) Inventors: Doo Hyeb Youn, Sejong-si (KR); Sun Jin Yun, Daejeon (KR); Changbong Yeon, Namyangju-si (KR); Young-Jun Yu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 150 days.

(21) Appl. No.: 15/465,740

(22) Filed: Mar. 22, 2017

(65) Prior Publication Data
US 2018/0019347 A1    Jan. 18, 2018

(30) Foreign Application Priority Data

Jul. 13, 2016    (KR) .................. 10-2016-0088867

(51) Int. Cl.
*H01L 21/04*    (2006.01)
*H01L 29/16*    (2006.01)
(Continued)

(52) U.S. Cl.
CPC ...... *H01L 29/78618* (2013.01); *H01L 21/043* (2013.01); *H01L 21/445* (2013.01);
(Continued)

(58) Field of Classification Search
CPC ........... H01L 21/47635; H01L 29/1606; H01L 29/24; H01L 29/78696; H01L 29/66045
(Continued)

(56) References Cited

U.S. PATENT DOCUMENTS 7,378,292 B2    5/2008  Park et al.
2007/0275193 A1* 11/2007 DeSimone ........ B01L 3/502707
                                                    428/34.1
(Continued)

FOREIGN PATENT DOCUMENTS

JP       2004-362948 A    12/2004
KR    10-2015-0031526 A     3/2015
(Continued)

OTHER PUBLICATIONS

Mi-Sun Lee et al., "Studies on the mechanical stretchability of transparent conductive film based on graphene-metal nanowire structures", Nanoscale Research Letters, Jan. 31, 2015, 10:27, pp. 1-9.

*Primary Examiner* — Bo Fan
(74) *Attorney, Agent, or Firm* — Rabin & Berdo, P.C.

(57) ABSTRACT

Disclosed are an electronic device and a method of fabricating the same. The method of fabricating an electronic device comprises providing on a substrate a channel layer including a two-dimensional material, providing a metal fiber layer on a first surface of a conductive layer, providing the metal fiber layer on the channel layer, and performing a thermal treatment process to form a junction layer where a portion of the metal fiber layer is covalently bonded to a portion of the channel layer.

9 Claims, 10 Drawing Sheets

(51) Int. Cl.
*H01L 29/24* (2006.01)
*H01L 29/45* (2006.01)
*H01L 29/66* (2006.01)
*H01L 21/445* (2006.01)
*H01L 29/772* (2006.01)
*H01L 29/786* (2006.01)
*H01L 21/4763* (2006.01)

(52) U.S. Cl.
CPC .... *H01L 21/47635* (2013.01); *H01L 29/1606* (2013.01); *H01L 29/24* (2013.01); *H01L 29/45* (2013.01); *H01L 29/66045* (2013.01); *H01L 29/66742* (2013.01); *H01L 29/66969* (2013.01); *H01L 29/772* (2013.01); *H01L 29/78684* (2013.01); *H01L 29/78696* (2013.01)

(58) Field of Classification Search
USPC ............... 257/98, 684; 361/717; 280/609; 429/413, 437; 372/69
See application file for complete search history.

(56) References Cited

U.S. PATENT DOCUMENTS

| | | | |
|---|---|---|---|
| 2010/0283069 A1* | 11/2010 | Rogers | H01L 27/14643 257/98 |
| 2014/0035044 A1 | 2/2014 | Ahn et al. | |
| 2016/0319463 A1 | 11/2016 | Park et al. | |

FOREIGN PATENT DOCUMENTS

| | | |
|---|---|---|
| KR | 10-1513148 B1 | 4/2015 |
| WO | WO-2015/037848 | 3/2015 |

\* cited by examiner

ELECTRONIC DEVICE AND METHODS OF FABRICATING THE SAME

CROSS-REFERENCE TO RELATED APPLICATIONS

This U.S. nonprovisional patent application claims priority under 35 U.S.C § 119 of Korean Patent Application 10-2016-0088867 filed on Jul. 13, 2016 entire contents of which are hereby incorporated by reference.

BACKGROUND

The present inventive concept relates to an electronic device and a method of fabricating the same.

A two-dimensional material is one of materials that have recently received the spotlight. Graphene is a representative of the two-dimensional materials. Graphene may be provided in a single-layered structure where hexagonal shapes each including six carbon atoms are two-dimensionally arranged. Graphene can be obtained from graphite; as a simple way, a scotch tape is used to detach its plates from graphite. Graphene exhibits excellent physical properties such as high elasticity, good chemical stability, a large surface area two times or more than that of active carbon, as well as electrical properties such as good electrical conductivity and high charge mobility. Nowadays intensive researches are being made to utilize graphene and other two-dimensional materials in various fields such as an electric device, a display, a semiconductor, a cathode material of lithium-ion battery, an environmental filter, and biomaterial.

SUMMARY

Embodiments of the present inventive concept provide an electronic device and a method of fabricating the same having high charge mobility on a surface of a channel layer.

Embodiments of the present inventive concept provide an electronic device and a method of fabricating the same having high charge mobility at a boundary between a metal fiber layer and a channel layer.

An object of the present inventive concept is not limited to the above-mentioned one, other objects which have not been mentioned above will be clearly understood to those skilled in the art from the following description.

According to exemplary embodiments of the present inventive concept, a method of fabricating an electronic device may comprise: providing on a substrate a channel layer including a two-dimensional material; providing a metal fiber layer on a first surface of a conductive layer; providing the metal fiber layer on the channel layer; and performing a thermal treatment process to form a junction layer where a portion of the metal fiber layer is covalently bonded to a portion of the channel layer.

In some embodiments, the step of providing the metal fiber layer may comprise electro-spinning a spray solution including an ohmic metal material on the first surface.

In some embodiments, the ohmic metal material may comprise at least one of Mo, W, Ni, Pd, or Ti.

In some embodiments, the metal fiber layer may be provided in a grid shape or an irregular shape on the first surface.

In some embodiments, the two-dimensional material may comprise at least one of molybdenum disulfide ($MoS_2$), tungsten disulfide ($WS_2$), molybdenum diselenide ($MoSe_2$), tungsten diselenide ($WSe_2$), black phosphor, or graphene.

In some embodiments, the method may further comprise providing a gate insulating layer on the channel layer.

In some embodiments, the method may further comprise etching a portion of the conductive layer and a portion of the metal fiber layer. The portions of the conductive layer and the metal fiber layer may be adjacent to a boundary of the gate insulating layer.

In some embodiments, the conductive layer may comprise at least one of graphene, graphite, or carbon nanotube.

In some embodiments, the conductive layer may be provided on a collector substrate. The method may further comprise, after providing the metal fiber layer on the first surface, separating the conductive layer from the collector substrate.

According to exemplary embodiments of the present inventive concept, an electronic device may comprise: a channel layer on a substrate and including a two-dimensional material; a metal fiber layer on the channel layer; and a junction layer between the metal fiber layer and the channel layer. The junction layer may be formed by a covalent bonding between the metal fiber layer and the channel layer.

In some embodiments, the metal fiber layer may comprise at least one of Mo, W, Ni, Pd, or Ti.

In some embodiments, the two-dimensional material may comprise at least one of molybdenum disulfide ($MoS_2$), tungsten disulfide ($WS_2$), molybdenum diselenide ($MoSe_2$), tungsten diselenide ($WSe_2$), black phosphor, or graphene.

In some embodiments, the device may further comprise a conductive layer covering the metal fiber layer.

In some embodiments, the device may further comprise a gate insulating layer between the channel layer and the metal fiber layer.

In some embodiments, the metal fiber layer may comprise: a gate layer on the gate insulating layer; a source layer spaced apart from a side of the gate insulating layer; and a drain layer spaced apart from an opposite side of the gate insulating layer.

In some embodiments, the metal fiber layer may be provided in a grid shape or an irregular shape on the channel layer.

In some embodiments, the junction layer and the metal fiber layer may overlap each other.

Details of other exemplary embodiments are included in the description and drawings.

DETAILED DESCRIPTION OF EMBODIMENTS

Figure 1:
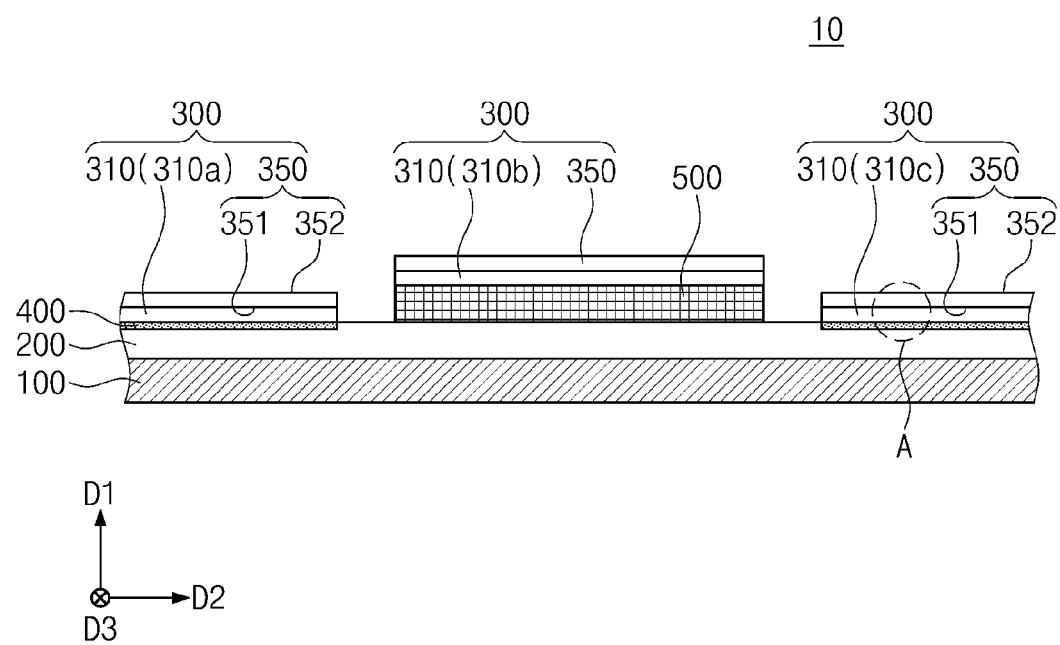
FIG. 1 is a cross-sectional view for explaining an electronic device according to exemplary embodiments of the present inventive concept.

The advantages and features of the present invention, and methods of achieving them will be apparent from the following exemplary embodiments that will be described below in detail with reference to the accompanying drawings showing the exemplary embodiments. It should be noted, however, that the present invention is not limited to the following exemplary embodiments, and may be implemented in various forms. Rather, the exemplary embodiments are provided only to disclose the present invention and let those skilled in the art fully know the scope of the present invention. The present invention is defined only by the scope of the claims and equivalents thereof. Like reference numerals refer to like elements throughout the specification.

Exemplary embodiments detailed in this description will be discussed with reference to sectional and/or plan views as idealized exemplary views of the present invention. In the drawings, thicknesses of layers and regions are exaggerated for effectively explaining the technical contents. Accordingly, regions exemplarily illustrated in the drawings are schematic in nature, and their shapes are intended to exemplarily disclose actual shapes of a region of a device and are not intended to limit the scope of the scope of the present invention. It will be understood that, although the terms "first", "second", "third", etc. may be used herein to describe various elements, these elements should not be limited by these terms. These terms are only used to distinguish one element from another element. The exemplary embodiments explained and illustrated herein include complementary embodiments thereof.

The terminology used herein is for the purpose of describing particular embodiments only and is not intended to limit the present invention. As used herein, the singular forms are intended to include the plural forms as well. It will be understood that the terms "comprises", and/or "comprising" specify the presence of stated elements, steps, operations, and/or devices, but do not preclude the presence or addition of one or more other elements, steps, operations, and/or devices.

Unless otherwise defined, all terms (including technical and scientific terms) used herein have the same meaning as commonly understood by one of ordinary skill in the art to which exemplary embodiments of the present invention belong. It will be further understood that terms, such as those defined in commonly-used dictionaries, are not interpreted in an idealized or overly formal sense unless expressly so defined herein.

It will be herein discussed about the present inventive concept and embodiments according to the present inventive concept with reference to drawings.

Figure 2:
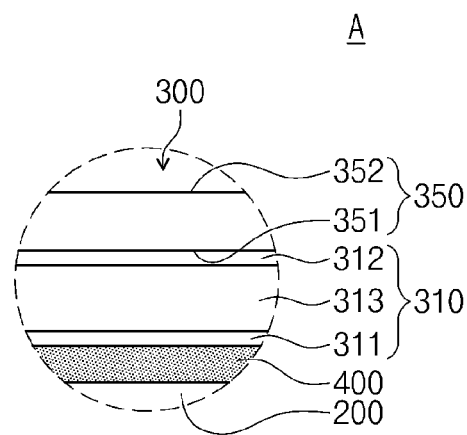
FIG. 2 is an enlarged view of section A shown in FIG. 1.

FIG. 1 is a cross-sectional view for explaining an electronic device according to exemplary embodiments of the present inventive concept. FIG. 2 is an enlarged view of section A shown in FIG. 1.

Referring to FIGS. 1 and 2, an electronic device 10 may be a transistor, but not limited thereto. The electronic device 10 may be provided in a rectangular parallelepiped shape, but not limited thereto. The electronic device 10 may include a substrate 100, a channel layer 200, a conductive sheet 300, and a junction layer 400. The electronic device 10 may further include a gate insulating layer 500.

The substrate 100 may support the channel layer 200, the junction layer 400, the conductive sheet 300, and the gate insulating layer 500. For example, the channel layer 200, the junction layer 400, and the conductive sheet 300 may be sequentially provided on the substrate 100.

The substrate 100 may have a top surface and a bottom surface facing each other. Hereinafter, the top surface may indicate a surface facing forward in a first direction D1, and the bottom surface may indicate a surface facing forward in a direction inverse to the first direction D1. The top and/or the bottom surfaces of the substrate 100 may be a flat surface. The substrate 100 may include a transparent material. For example, the substrate 100 may include glass, quartz, silicon oxide, aluminum oxide, or polymer.

The channel layer 200 may be disposed on the top surface of the substrate 100. The channel layer 200 may have a top surface and a bottom surface facing each other. In some embodiments, the bottom surface of the channel layer 200 may be in contact with the top surface of the substrate 100. Alternatively, in other embodiments, the bottom surface of the channel layer 200 may be spaced apart from the top surface of the substrate 100. The top surface of the channel layer 200 may be in contact with the conductive sheet 300 and the gate insulating layer 500. The top and bottom surfaces of the channel layer 200 may be flat surfaces.

The channel layer 200 may include a two-dimensional material. The two-dimensional layer may include a plurality of layers that are bonded by van der Waals force. The two-dimensional material may mean a material where bonding strength between atoms of one layer is greater than that between the plurality of layers. Therefore, the plurality of layers of the two-dimensional material may be easily separated from each other by mechanical exfoliation.

The two-dimensional material may include at least one of molybdenum disulfide (MoS2), tungsten disulfide (WS2), molybdenum diselenide (MoSe2), tungsten diselenide (WSe2), black phosphor, or graphene. In some embodiments, the two-dimensional material may be, but not limited to, graphene. Graphene may provide a two-dimensional shaped carbon nanostructure. Graphene may have large charge mobility of about 15,000 cm$^2$/Vs, and may have high thermal conductivity. Graphene may also have excellent light transmittance. The channel layer 200 including the two-dimensional material may include a plurality of domains (see D of FIG. 3), which will be further discussed in detail below with reference to FIGS. 3 and 4.

The channel layer 200 may include a small thickness. A thickness of the channel layer 200 may be thin. For example, the channel layer 200 may have a thickness of about 10 nm or less. Herein, the thickness may mean a distance between the top surface and the bottom surface of the channel layer 200. The top surface of the channel layer 200 may have no dangling bond. Thus, the top surface of the channel layer 200 may not be covalently or otherwise bonded to a metal fiber layer 310 which will be discussed below. This will be further discussed in detail below.

The conductive sheet 300 may be provided on the channel layer 200 and the gate insulating layer 500. The conductive sheet 300 may include a metal fiber layer 310 and a conductive layer 350.

The metal fiber layer 310 may be disposed on the top surface of the channel layer 200. The metal fiber layer 310 may include a metal material that can be in ohmic contact with the two-dimensional material of the channel layer 200.

In some embodiments, the metal material may include, but not limited to, at least one of Mo, W, Ni, Pd, and/or Ti.

The metal fiber layer 310 may be provided in various shapes on the top surface of the channel layer 200. For example, the metal fiber layer 310 may be provided in a grid pattern or an irregular pattern on the top surface of the channel layer 200.

The metal fiber layer 310 may include first, second, and third metal fiber segments 311, 312, and 313. The first metal fiber segment 311 may be in contact with the top surface of the channel layer 200. The first metal fiber segment 311 may be a portion thermally treated to covalently bond to the channel layer 200. The second metal fiber segment 312 may be spaced apart from the first metal fiber segment 311. The second metal fiber segment 312 may be in contact with the conductive layer 350. The second metal fiber segment 312 may be a portion thermally treated to covalently bond to the conductive layer 350. The third metal fiber segment 313 may be disposed between the first and second metal fiber segments 311 and 312.

In some embodiments, the metal fiber layer 310 may be classified into a gate electrode, a source electrode, and a drain electrode. The gate electrode may correspond to a metal fiber layer 310*b* (referred to hereinafter as a gate layer) on the gate insulating layer 500. The source electrode may correspond to a metal fiber layer 310*a* (referred to hereinafter as a source layer) adjacent to a side of the gate insulating layer 500. The drain electrode may correspond to a metal fiber layer 310*c* (referred to hereinafter as a drain layer) adjacent to an opposite side of the gate insulating layer 500. The drain layer 310*c* may be disposed away from the gate layer 310*b* along the second direction D2. The gate layer 310*b* may be disposed away from the source layer 310*a* along the second direction D2. The source layer 310*a* and the drain layer 310*c* may be spaced apart from each other, and may be symmetric about the gate insulating layer 500.

The channel layer 200 may have a source region at its region overlapping the source layer 310*a*. The channel layer 200 may have a drain region at its region overlapping the drain layer 310*c*. The channel layer 200 may have therein a channel region where charge is transferred between the source region and the drain region.

The metal fiber layer 310 may have a small thickness. The thickness of the metal fiber layer 310 may be thin. The metal fiber layer 310 may thus have high visible light transmittance of about 90% or more. Herein, the thickness of the metal fiber layer 310 may mean a distance between the top surface and the bottom surface of the metal fiber layer 310. The metal fiber layer 310 may have a uniform line width. For example, the metal fiber layer 310 may have a line width ranging from about 50 nm to about 500 nm.

The conductive layer 350 may have a first surface 351 and a second surface 352 facing each other. The conductive layer 350 may cover the metal fiber layer 310. The metal fiber layer 310 may be disposed on the first surface 351 of the conductive layer 350. The metal fiber layer 310 may therefore be disposed between the first surface 351 of the conductive layer 350 and the top surface of the channel layer 200.

In some embodiments, the metal fiber layer 310 may be provided thereon with the conductive layer 350 formed by a soft transfer printing technique, a PDMS (polydimethylsiloxane) transfer technique, a PMMA (polymethylmethacrylate) transfer technique, a thermal dissipation tape transfer technique, or a roll transfer technique, but not limited thereto. The conductive layer 350 may prevent oxidation of the metal fiber layer 310. The conductive layer 350 may be provided in a rectangular shape, but not limited thereto.

The conductive layer 350 may be composed of a transparent material. The conductive layer 350 may include a two-dimensional material. The two-dimensional material of the conductive layer 350 may be the same as that of the channel layer 200. For example, the two-dimensional material of the conductive layer 350 may include at least one of graphene, graphite, or carbon nanotube. Alternatively, in other embodiments, the conductive layer 350 may include a two-dimensional material different from that of the channel layer 200.

The conductive layer 350 and the metal fiber layer 310 may be provided on the junction layer 400 and the gate insulating layer 500, but may not be provided between the junction layer 400 and the gate insulating layer 500.

The junction layer 400 may be disposed between the metal fiber layer 310 and the channel layer 200. The junction layer 400 may be a region where the metal fiber layer 310 and the channel layer 200 are covalently bonded to each other by a thermal treatment process. In other words, the junction layer 400 may be a region where an ohmic metal material and a two-dimensional material are covalently bonded. The junction layer 400 may vertically overlap the metal fiber layer 310. The thermal treatment process may be performed at a temperature of about 850° C.

The junction layer 400 may remove or reduce a Schottky barrier caused by van der Waals gap between the metal fiber layer 310 and the channel layer 200. In other words, the junction layer 400 may mean a layer capable of being in ohmic contact or reducing an a Schottky barrier. The junction layer 400 will be further discussed in detail below.

The gate insulating layer 500 may be disposed between the metal fiber layer 310 and the channel layer 200. In some embodiments, the gate insulating layer 500 may be disposed on a central zone of the channel layer 200, but not limited thereto. The gate insulating layer 500 may insulate the gate layer 310*b* from the channel layer 200. The gate insulating layer 500 may include an oxide material. For example, the gate insulating layer 500 may include Al2O3.

Figure 3:
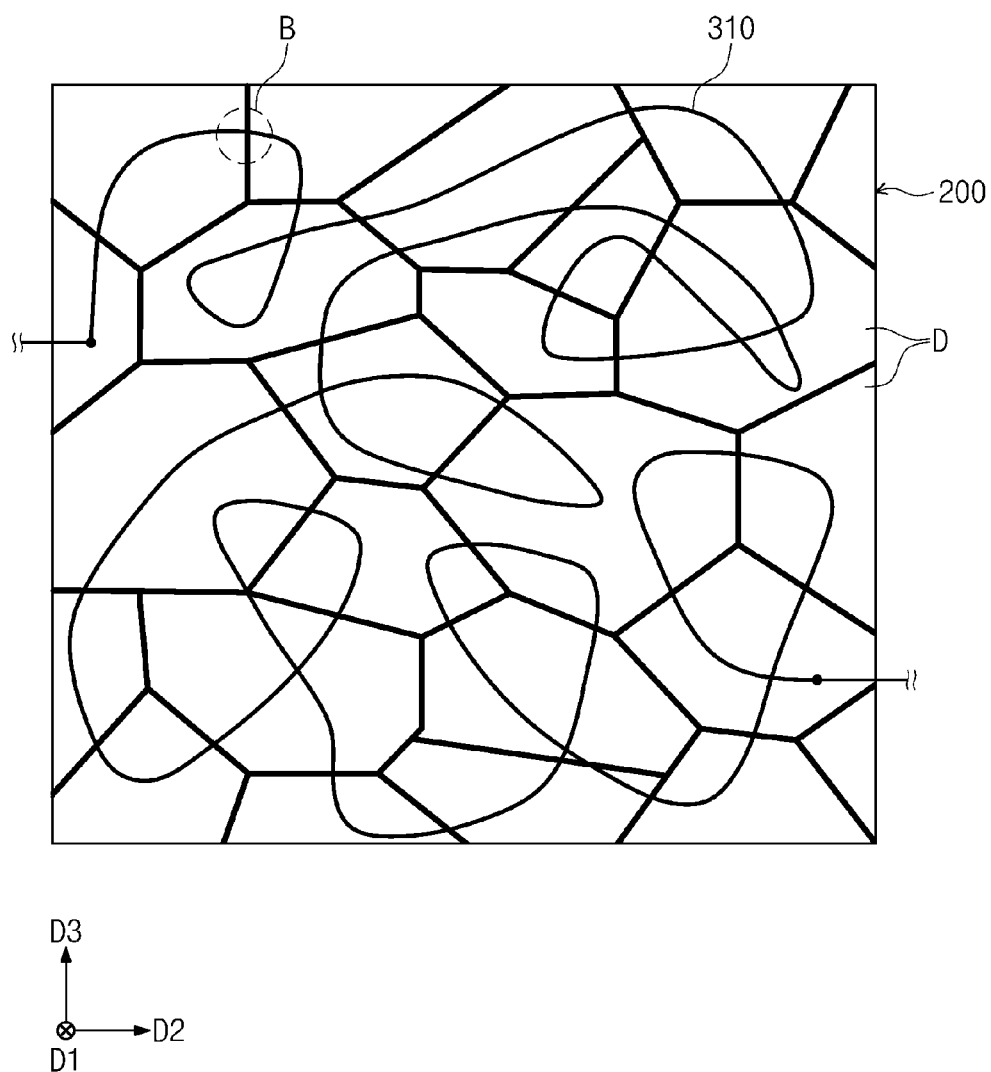
FIG. 3 is a plan view for explaining a metal fiber layer and a channel layer of FIG. 1.
Figure 4:
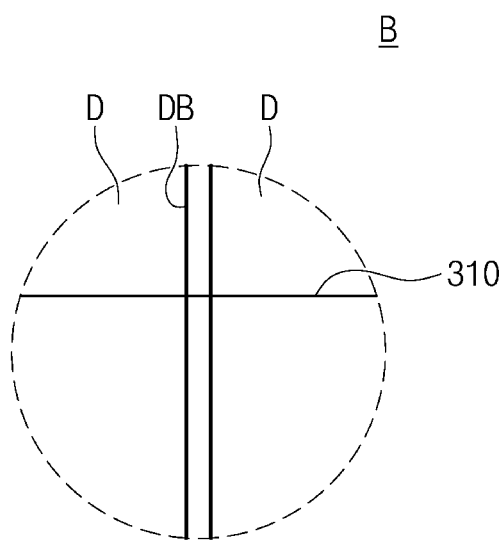
FIG. 4 is an enlarged view of section B shown in FIG. 3.

FIG. 3 is a plan view for explaining the metal fiber layer and the channel layer of FIG. 1. FIG. 4 is an enlarged view of section B shown in FIG. 3. FIG. 3 omits the gate insulating layer and the conductive layer from the electronic device shown in FIG. 1.

Referring to FIGS. 3 and 4, the channel layer 200 may include a polycrystalline two-dimensional material. For example, the channel layer 200 may include at least one of molybdenum disulfide (MoS2), tungsten disulfide (WS2), molybdenum diselenide (MoSe2), tungsten diselenide (WSe2), black phosphor, or graphene. The channel layer 200 may include a plurality of domains D, each of the domains D may be a region having substantially the same crystallographic direction. The channel layer 200 may include a domain boundary DB between the plurality of domains D. The domain boundary DB may be an interface between a plurality of domains D having crystallographic directions different from each other. The domain boundary DB may act as a kind of crystal defects, and may increase surface resistance of the channel layer 200.

The metal fiber layer 310 may be connected to an external power source, which may apply power to the metal fiber layer 310. When power is applied, charge may be transferred along the metal fiber layer 310. The metal fiber layer 310 may run across the domains D adjacent to each other. The metal fiber layer 310 may allow charge to efficiently move along a surface of the channel layer 200.

Figure 5A:
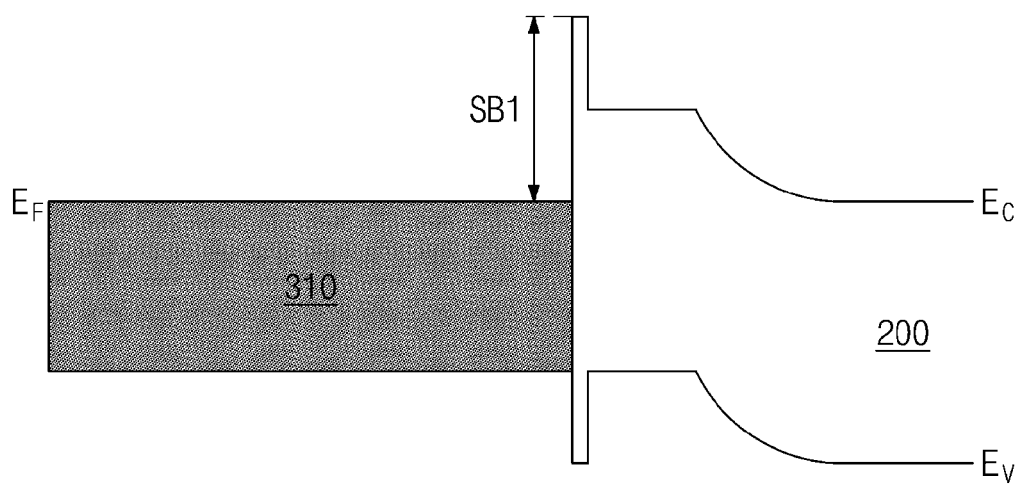
FIG. 5A is a diagram for explaining an energy band gap between a metal fiber layer and a channel layer shown in FIG. 1.
Figure 5B:
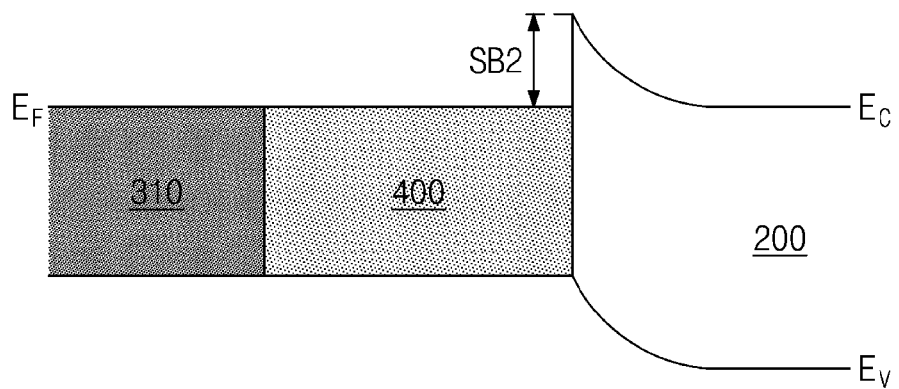
FIG. 5B is a diagram for explaining an energy band gap among a metal fiber layer, a junction layer, and a channel layer shown in FIG. 1.

FIG. 5A is a diagram for explaining an energy band gap between the metal fiber layer and the channel layer shown in FIG. 1. FIG. 5B is a diagram for explaining an energy band gap among the metal fiber layer, the junction layer, and the channel layer shown in FIG. 1. FIG. 5A shows an energy band gap of the electronic device 10 without the junction layer 400, and FIG. 5B shows an energy band gap of the electronic device 10 with the junction layer 400.

In FIGS. 5A and 5B, Ef designates an energy level at which the probability of presence of charge is about 50%, Ev denotes an energy level at which charge is immovable due to the covalent bonding, and Ec indicates an energy level at which charge is movable out of the covalent bonding.

Referring to FIG. 5A, when the junction layer 400 is not present at a boundary between the channel layer 200 and the metal fiber layer 310, a van der Waals gap may be produced between the channel layer 200 and the metal fiber layer 310. The van der Waals gap may create a high Schottky barrier SB1 at the boundary between the metal fiber layer 310 and the channel layer 200. The Schottky barrier SB1 may provide high contact resistance at the boundary between the metal fiber layer 310 and the channel layer 200. As such, the Schottly barrier SB1 may prevent charge from moving into the channel layer 200 from the metal fiber layer 310.

Referring to FIG. 5B, the junction layer 400 may decrease the van der Waals gap at the boundary between the channel layer 200 and the metal fiber layer 310. The reduced van der Waals gap may create a Schottky barrier SB2 that is lower compared with the case of absence of the junction layer 400. Alternatively, the junction layer 400 may remove the van der Waals gap at the boundary between the channel layer 200 and the metal fiber layer 310. As a result, the Schottly barrier SB2 may disappear.

To put it differently, the electronic device 10 including the junction layer 400 therein may have smaller contact resistance at the boundary between the channel layer 200 and the metal fiber layer 310, compared with an electronic device including no junction layer 400 therein. Therefore, charge may be efficiently transferred from the metal fiber layer 310 to the channel layer 200.

Figure 6:
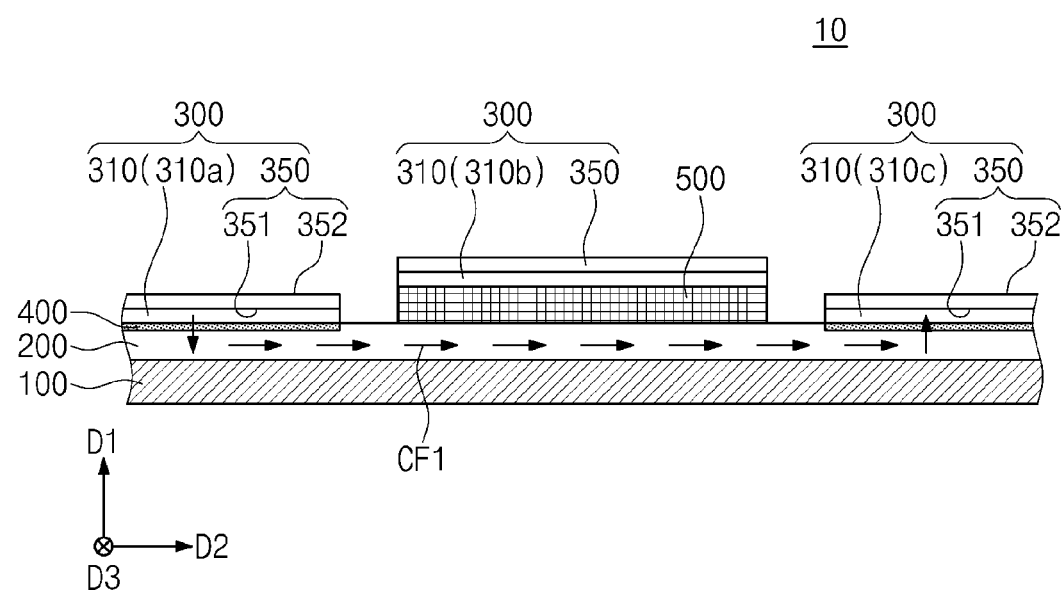
FIG. 6 is a cross-sectional view for explaining a charge transfer between a metal fiber layer and a channel layer shown in FIG. 1.
Figure 7:
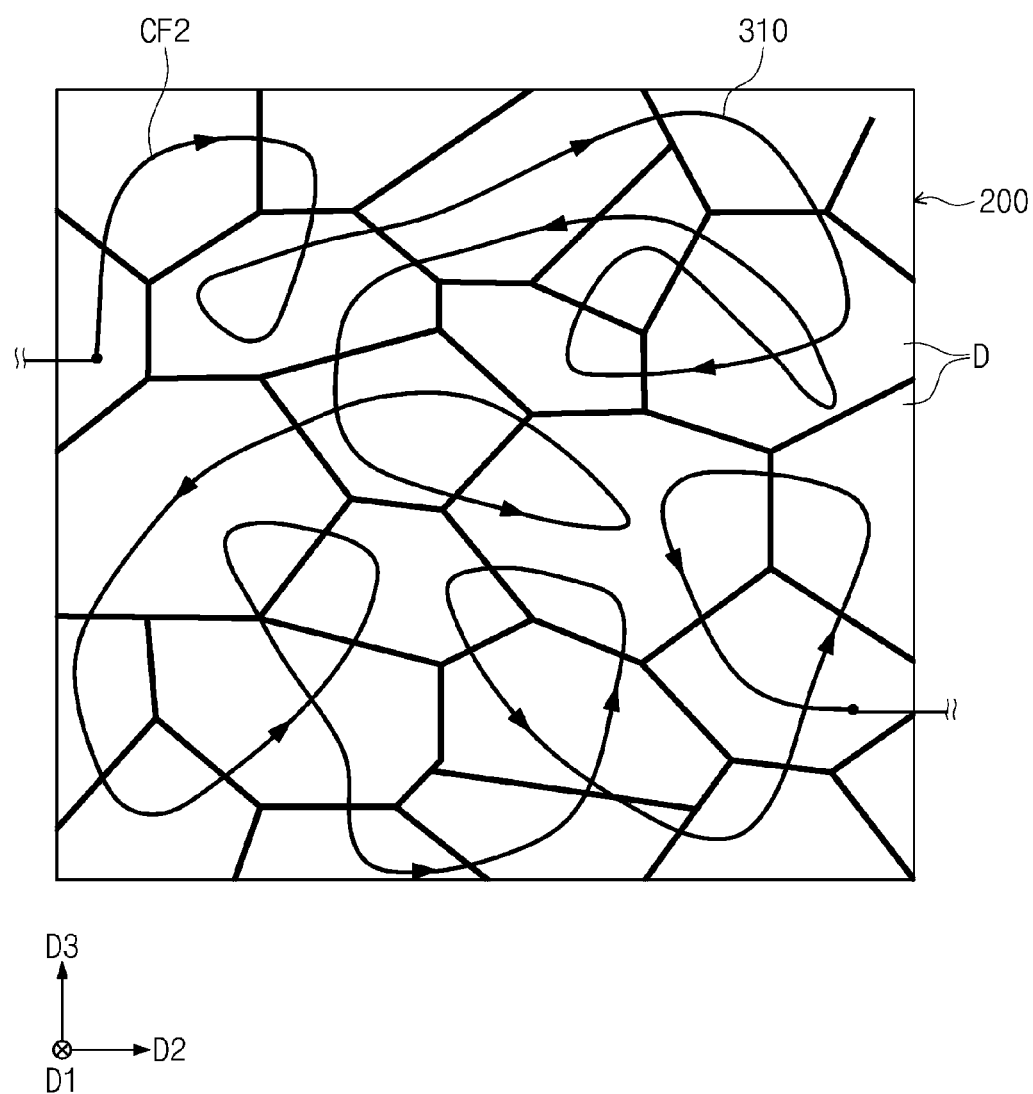
FIG. 7 is a plan view for explaining a charge transfer on a metal fiber layer of FIG. 1.

FIG. 6 is a cross-sectional view for explaining a charge transfer between the metal fiber layer and the channel layer shown in FIG. 1. FIG. 7 is a plan view for explaining a charge transfer on the metal fiber layer of FIG. 1.

Referring to FIGS. 1 and 6, the junction layer 400 may allow charge CF1 to efficiently move from the metal fiber layer 310 toward the channel layer 200. The junction layer 400 may therefore increase current flowing from the metal fiber layer 310 to the channel layer 200.

In some embodiments, the junction layer 400 may allow the charge CF1 to move from the source layer 310a into the source region of the channel layer 200. The charge CF1 transferred into the source region may move through the channel region into the drain region of the channel layer 200. The charge CF1 transferred into the drain region may move through the junction layer 400 into the drain layer 310c.

Referring to FIGS. 3 and 7, charge CF2 may be transferred along the metal fiber layer 310 on the top surface of the channel layer 200. Therefore, charge transfer may not be hindered by the domain boundary DB.

Figure 8:
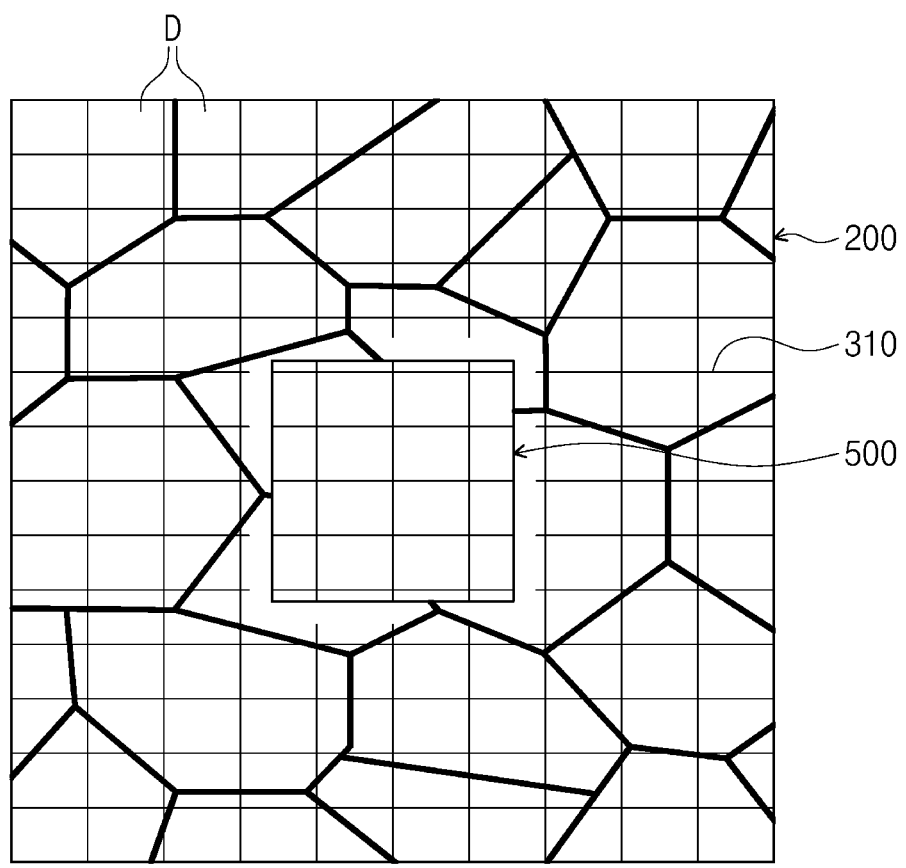
FIG. 8 is a cross-sectional view for explaining an electronic device according to exemplary embodiments of the present inventive concept.

FIG. 8 is a cross-sectional view for explaining an electronic device according to exemplary embodiments of the present inventive concept. An electronic device illustrated in FIG. 8 is configured similar to that discussed with reference to FIGS. 1 and 2. For the sake of simplification, the description about substantially the same configuration will be omitted or roughly described, and different configurations will be mainly discussed in detail.

Referring to FIG. 8, an electronic device 11 may include the substrate (see 100 of FIG. 1), the channel layer 200, the conductive sheet (see 300 of FIG. 1), and the junction layer (see 400 of FIG. 1). The metal fiber layer 310 may be provided in a grid pattern on the top surface of the channel layer 200. The metal fiber layer 310 may also be provided in a grid pattern on the gate insulating layer 500.

FIGS. 9A to 9E are perspective views for explaining a method of fabricating an electronic device of FIG. 1.

Figure 9A:
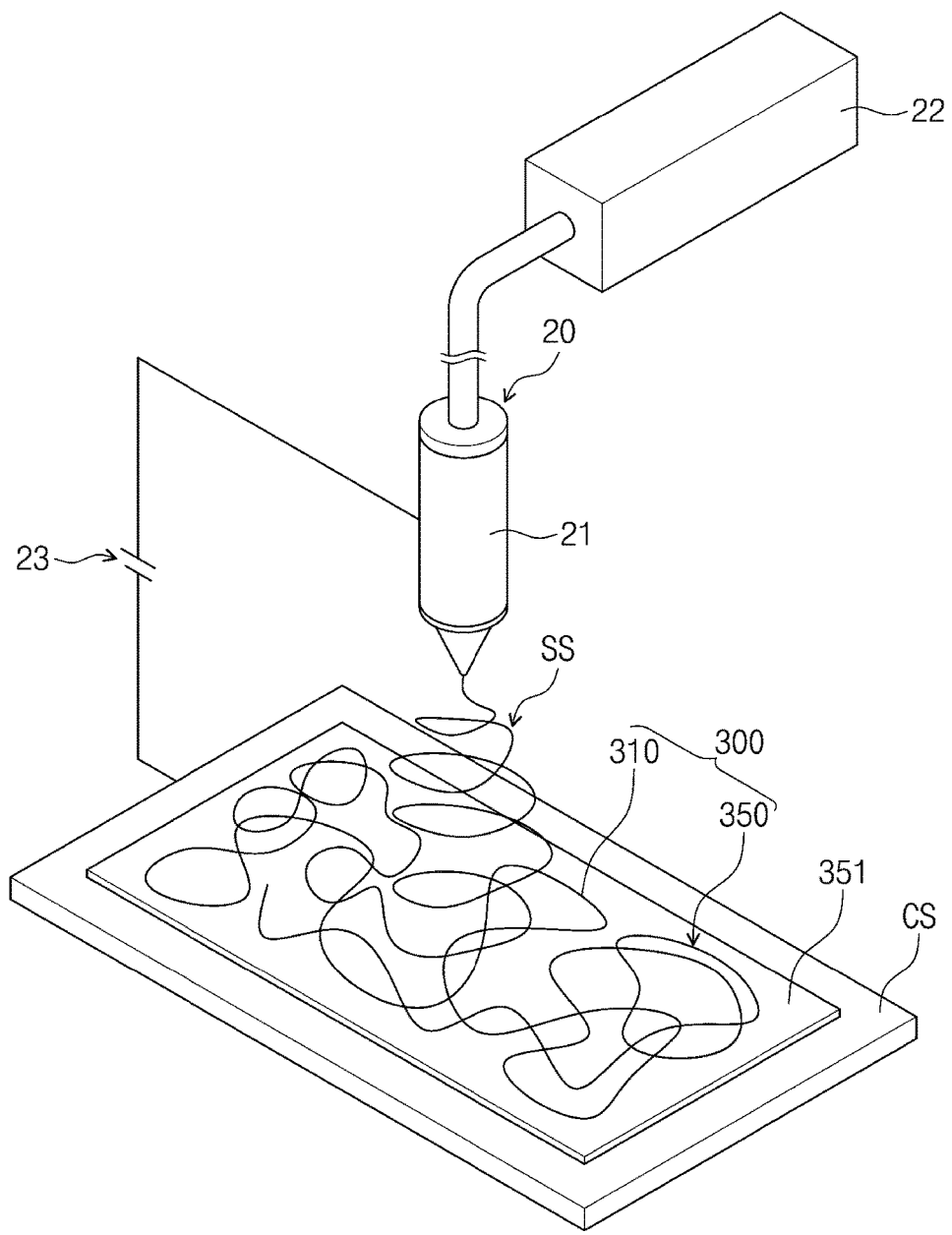
FIGS. 9A to 9E are perspective views for explaining a method of fabricating an electronic device of FIG. 1.

Referring to FIGS. 1 and 9A, an electro-spinning apparatus 20 may be used to provide a metal fiber layer 310 on a first surface 351 of a conductive layer 350. In some embodiments, the conductive layer 350 may be provided on a collector substrate CS. In this step, a second surface 352 of the conductive layer 350 may be in contact with a top surface of the collector substrate CS.

The collector substrate CS may be disposed below the electro-spinning apparatus 20. In some embodiments, the collector substrate CS may include a conductive material. For example, the collector substrate CS may include a metal material.

The collector substrate CS may be ground. In some embodiments, the collector substrate CS may be applied with a ground voltage of about 0 V. Alternatively, in other embodiments, the collector substrate CS may be applied with a ground voltage reverse to a voltage applied to a capillary nozzle 21. For example, when the capillary nozzle 21 is applied with a positive voltage, the collector substrate CS may be applied with a negative voltage.

The electro-spinning apparatus 20 may be disposed above the first surface 351 of the conductive layer 350. The electro-spinning apparatus 20 may spray a solution SS (referred to hereinafter as a spray solution) on the first surface 351 of the conductive layer 350. In some embodiments, the electro-spinning apparatus 20 may include the capillary nozzle 21, a syringe pump 22, and a power supply unit 23. In some embodiments, the spray solution SS may include an ohmic metal material and/or a polymer material.

The capillary nozzle 21 may have a spray hole at its bottom end. The capillary nozzle 21 may accommodate the spray solution SS therein. The capillary nozzle 21 may be disposed spaced apart from the first surface 351 of the conductive layer 350. The syringe pump 22 may supply the capillary nozzle 21 with the spray solution SS.

The power supply unit 23 may apply voltage to the capillary nozzle 21. The voltage may be changed depending on a kind of solution, spray amount, etc. For example, the power supply unit 23 may apply voltage ranging from about 1,000 V to about 30,000 V. The power supply unit 23 may apply a direct voltage or an alternating voltage. When the capillary nozzle 21 is applied with voltage, the spray solution SS in the capillary nozzle 21 may have electric charge. In addition, a voltage difference may be produced between the capillary nozzle 21 and the collector substrate CS. Thus, an electric field may be generated between the capillary nozzle 21 and the collector substrate CS.

In some embodiments, the electric field may be in the range from about 50,000 V/m to about 150,000 V/m. The electric field may provide the spray solution SS with electric force. The electric force may act in a direction toward the collector substrate CS. The charged spray solution SS may thus form a conical shaped meniscus at the bottom end of the capillary nozzle 21. The charged spray solution SS may be sprayed in a straight line shape from a bottom end of the meniscus. The straight line shaped spray solution SS may have a diameter less than that of the spray hole of the capillary nozzle 21. For example, the straight line shaped spray solution SS may have a diameter of about several tens of nm. The straight line shaped spray solution SS may be provided on the first surface 351 of the conductive layer 350. A metal fiber layer 310 may be formed from the spray solution SS provided on the first surface 351. A conductive sheet 300 may therefore be formed to include the metal fiber layer 310 and the conductive layer 350.

A first thermal treatment process may be performed to remove a polymer material from the metal fiber layer 310. The first thermal treatment process may be carried out at a temperature ranging from about 500° C. to about 700° C.

A second thermal treatment process may be performed to remove oxygen (O2) from the metal fiber layer 310. The second thermal treatment process may be carried out at a temperature ranging from about 200° C. to about 400° C. The metal fiber layer 310 may be provided with hydrogen (H2(g)) during the second thermal treatment process. The provided hydrogen (H2(g)) may react with oxygen (O2) of the metal fiber layer 310 such that $H_2O$ may be produced. Oxygen (O2) may thus be removed from the metal fiber layer 310.

Only ohmic metal material may remain in the metal fiber layer 310 through the first and second thermal treatment processes. The metal fiber layer 310 may be covalently bonded to the conductive layer 350. Namely, the metal fiber layer 310 may be in ohmic contact with the first surface 351 of the conductive layer 350.

Figure 9B:
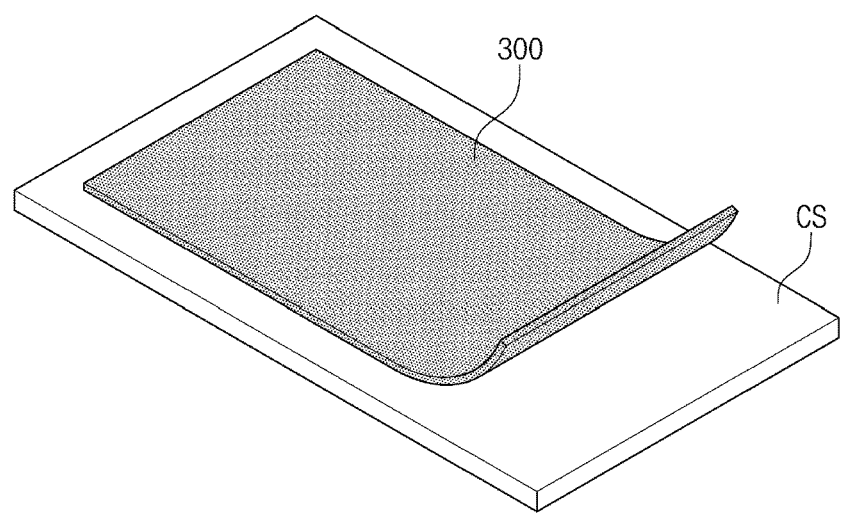

Referring to FIG. 9B, the conductive sheet 300 and the collector substrate CS may be soaked in an etching solution. The conductive sheet 300 may thus be separated from the collector substrate CS.

Figure 9C:
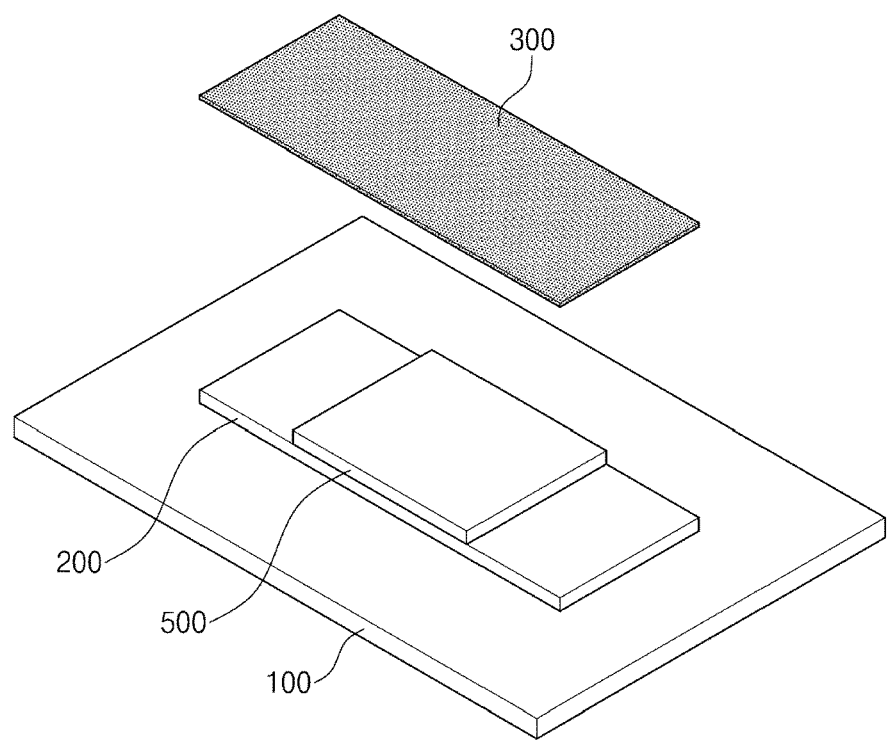

Referring to FIGS. 1 and 9C, a channel layer 200 and a gate insulating layer 500 may be sequentially stacked on a substrate 100. The conductive layer 350 may be turned upside down so as to change positions of the first and second surfaces 351 and 352. The metal fiber layer 310 may then be disposed to face the channel layer 200. In other words, the conductive sheet 300 may be turned upside down such that the metal fiber layer 310 may face the channel layer 200.

Figure 9D:
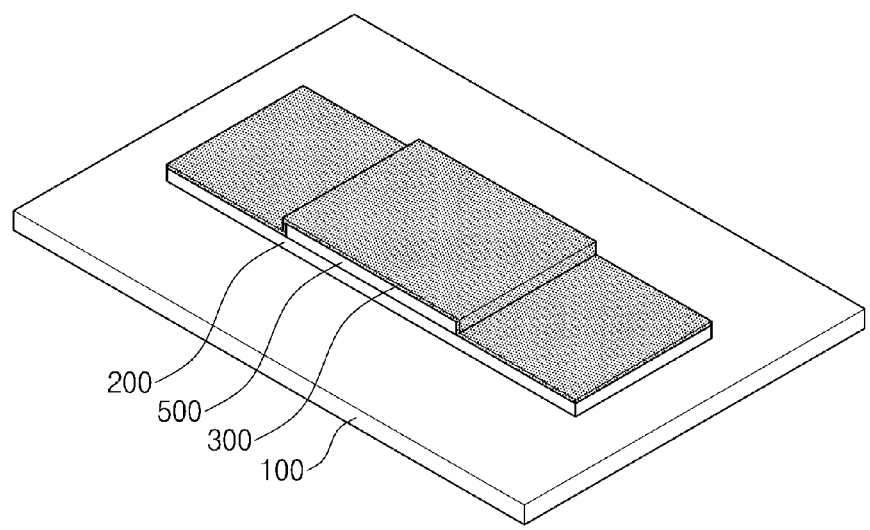

Referring to FIG. 9D, the conductive sheet 300 may be provided on a top surface of the channel layer 200. In detail, the metal fiber layer (see 310 of FIG. 9A) may be in contact with the top surface of the channel layer 200.

Figure 9E:
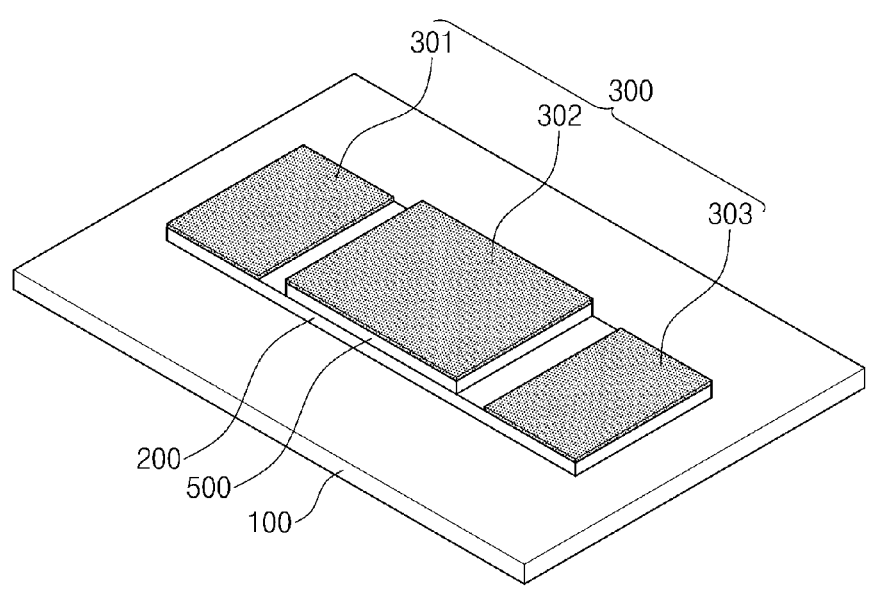

Referring to FIGS. 1 and 9E, the conductive sheet 300 may be etched at its portions adjacent to a boundary of the gate insulating layer 500. The conductive sheet 300 may be etched by a dry or wet etching. When the etching is done, the conductive sheet 300 may be modified to include a first sheet region 301 disposed on a side of the gate insulating layer 500, a second sheet region 302 disposed on the gate insulating layer 500, and a third sheet region 303 disposed on an opposite side of the gate insulating layer 500.

The first sheet region 301 may include a metal fiber layer 301a that serves as a source electrode. The second sheet region 302 may include a metal fiber layer 301b that serves as a gate electrode. The third sheet region 303 may include a metal fiber layer 301c that serves as a drain electrode.

In some embodiments, after the conductive sheet 300 is etched, additional thermal treatment process may be performed to covalently bond a portion of the metal fiber layer 310 to a portion of the channel layer 200. Therefore, a junction layer 400 may be formed between the metal fiber layer 310 and the channel layer 200. Alternatively, in other embodiments, the additional thermal treatment process may be performed before the conductive sheet 300 is etched.

According to exemplary embodiments of the present inventive concept, the metal fiber layer may be provided on a surface of the channel layer including a two-dimensional material. Charge may thus have high mobility on the surface of the channel layer along the metal fiber layer. In addition, the metal fiber layer may be in ohmic contact with the surface of the channel layer. Charge may therefore have high mobility at the boundary between the metal fiber layer and the channel layer.

Effects of the present inventive concept is not limited to the above-mentioned one, other effects which have not been mentioned above will be clearly understood to those skilled in the art from the following description.

Although the present inventive concept has been described in connection with the embodiments of the present inventive concept illustrated in the accompanying drawings, it will be understood by one of ordinary skill in the art that variations in form and detail may be made therein without departing from the spirit and essential features of the inventive concept. The above disclosed embodiments should thus be considered illustrative and not restrictive.

What is claimed is:

1. A method of fabricating an electronic device, the method comprising:
   providing on a substrate a channel layer including a two-dimensional material;
   providing a metal fiber layer on a first surface of a conductive layer;
   placing the conductive layer and the metal fiber layer on the channel layer, such that the first surface of the conductive layer faces the channel layer and the metal fiber layer is provided on the channel layer; and
   covalently bonding a portion of the metal fiber layer to a portion of the channel layer by a thermal treatment process, and forming a junction layer between the metal fiber and the channel layer.

2. The method of claim 1, wherein providing the metal fiber layer comprises electro-spinning a spray solution including an ohmic metal material on the first surface.

3. The method of claim 2, wherein the ohmic metal material comprises at least one of Mo, W, Ni, Pd, or Ti.

4. The method of claim 1, wherein the metal fiber layer is provided in a grid shape or an irregular shape on the first surface.

5. The method of claim 1, wherein the two-dimensional material comprises at least one of molybdenum disulfide (MoS2), tungsten disulfide (WS2), molybdenum diselenide (MoSe2), tungsten diselenide (WSe2), black phosphor, or graphene.

6. The method of claim 1, further comprising providing a gate insulating layer on the channel layer.

7. The method of claim 6, further comprising etching a portion of the conductive layer and a portion of the metal fiber layer, wherein the portions of the conductive layer and the metal fiber layer are adjacent to a boundary of the gate insulating layer.

8. The method of claim 1, wherein the conductive layer comprises at least one of graphene, graphite, or carbon nanotube.

9. The method of claim 1, wherein
   the conductive layer is provided on a collector substrate, and
   the method further comprises, after providing the metal fiber layer on the first surface, separating the conductive layer from the collector substrate.

* * * * *